(12) United States Patent
Liu

(10) Patent No.: US 8,619,456 B2
(45) Date of Patent: Dec. 31, 2013

(54) MEMORY ARRAYS AND ASSOCIATED METHODS OF MANUFACTURING

(75) Inventor: Jun Liu, Boise, ID (US)

(73) Assignee: Micron Technology, Boise, ID (US)

( * ) Notice: Subject to any disclaimer, the term of this patent is extended or adjusted under 35 U.S.C. 154(b) by 270 days.

(21) Appl. No.: 12/617,501

(22) Filed: Nov. 12, 2009

(65) Prior Publication Data

US 2011/0110148 A1    May 12, 2011

(51) Int. Cl.
*G11C 11/00*    (2006.01)
(52) U.S. Cl.
USPC .................... 365/148; 365/115; 365/163
(58) Field of Classification Search
USPC .......................... 365/115, 148, 163
See application file for complete search history.

(56) References Cited

U.S. PATENT DOCUMENTS

| | | | |
|---|---|---|---|
| 5,292,678 A | 3/1994 | Dhong et al. | |
| 6,510,080 B1 | 1/2003 | Farrar | |
| 6,522,579 B2 | 2/2003 | Hoenigschmid | |
| 6,961,258 B2 | 11/2005 | Lowrey | |
| 7,038,231 B2 | 5/2006 | Hart et al. | |
| 7,317,639 B2 | 1/2008 | Choi | |
| 2003/0075778 A1 | 4/2003 | Klersy | |
| 2008/0106931 A1* | 5/2008 | Toda | 365/163 |
| 2008/0200046 A1 | 8/2008 | Knoefler et al. | |
| 2008/0258129 A1* | 10/2008 | Toda | 257/5 |
| 2009/0147583 A1 | 6/2009 | Kim | |

FOREIGN PATENT DOCUMENTS

| | | |
|---|---|---|
| EP | 1378944 A1 | 1/2004 |
| WO | WO-02080283 A1 | 10/2002 |

OTHER PUBLICATIONS

Kim, K.-S. et al., Orthogonal Transpose-RAM Cell Array Architecture with Alternate Bit-Line to Bit-Line Contact Scheme, IEEE International Workshop on Memory Technology, Design and Testing, pp. 9-11, Aug. 2001.
International Search Report and Written Opinion issued Jun. 10, 2011 in International Application No. PCT/US2010/051900, 7 pages.
Office Action issued Jun. 28, 2013 in Taiwan Application No. 099137852, 19 pages.

* cited by examiner

*Primary Examiner* — Hoai V Ho
(74) *Attorney, Agent, or Firm* — Perkins Coie LLP

(57) ABSTRACT

Memory arrays and associated methods of manufacturing are disclosed herein. In one embodiment, a memory array includes an access line extending along a first direction and a first contact line and a second contact line extending along a second direction different from the first direction. The first and second contact lines are generally parallel to each other. The memory array also includes a memory node that includes a first memory cell electrically connected between the access line and the first contact line to form a first circuit, and a second memory cell electrically connected between the access line and the second contact line to form a second circuit different from the first circuit.

24 Claims, 16 Drawing Sheets

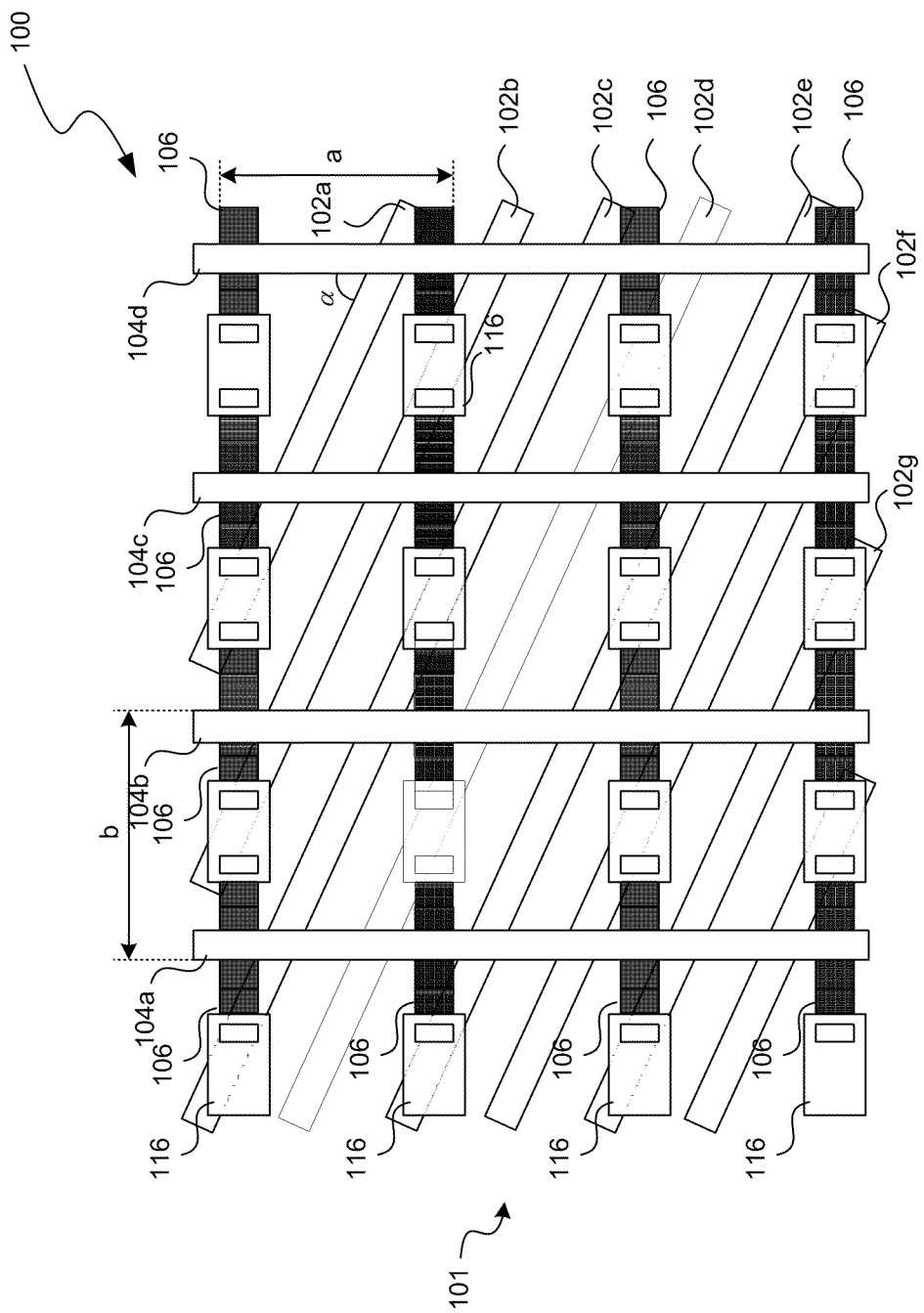

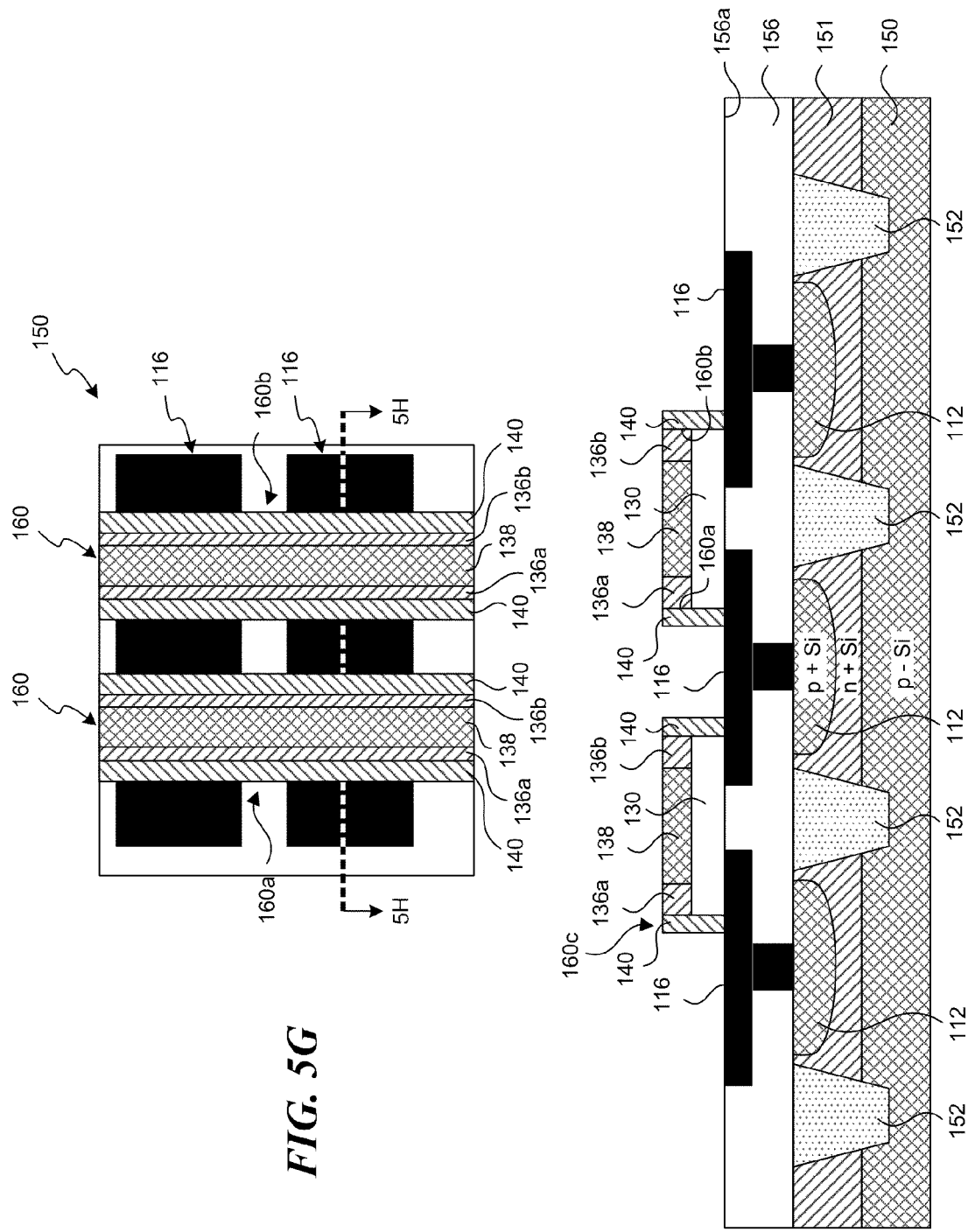

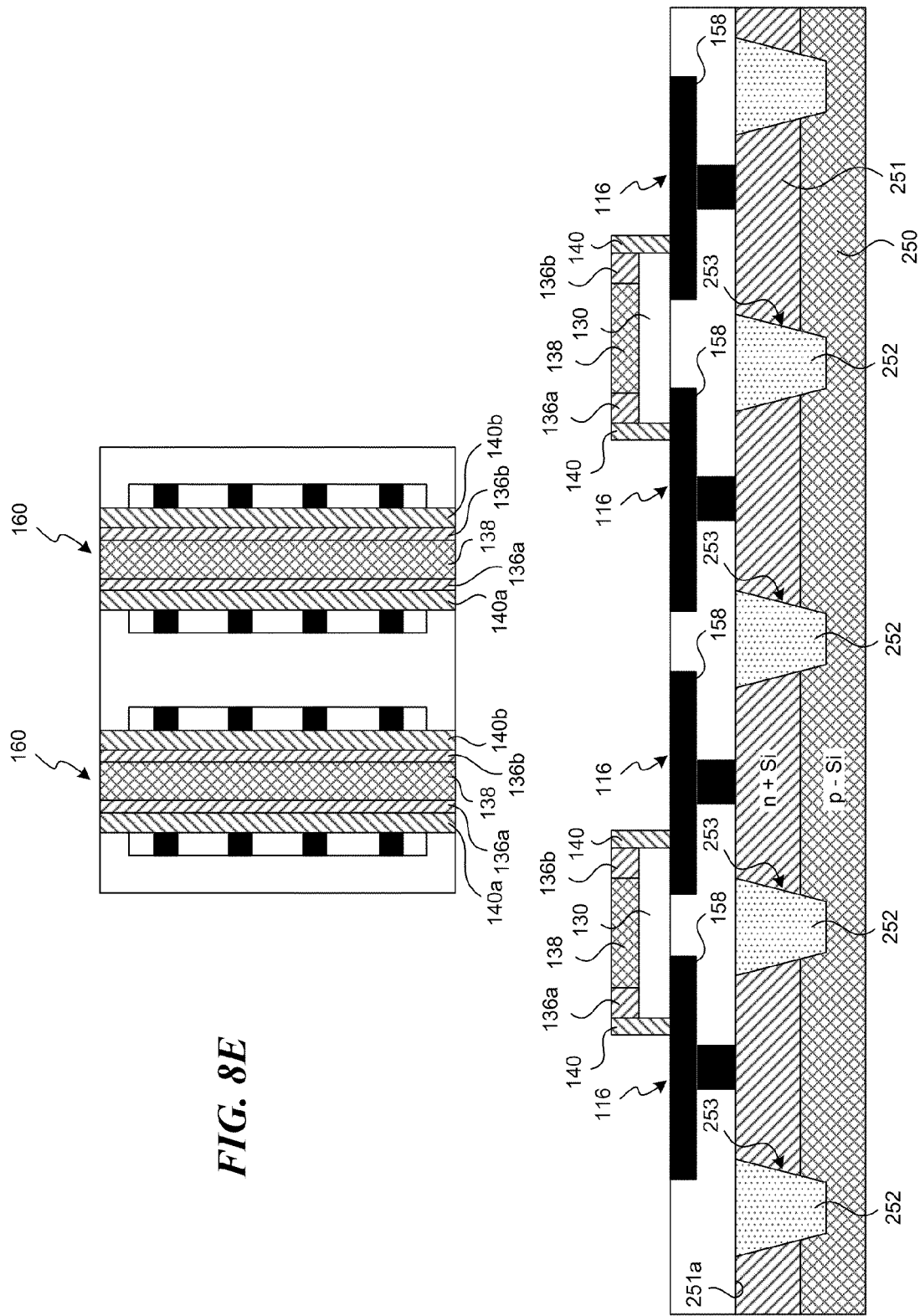

US 8,619,456 B2

MEMORY ARRAYS AND ASSOCIATED METHODS OF MANUFACTURING

TECHNICAL FIELD

The present technology is directed generally to memory arrays and associated methods of manufacturing.

BACKGROUND

Memory cells (e.g., floating-gate transistors or PCRAM cells) are typically arranged in an array connected to a grid formed by a plurality of Word lines and Bit lines. The Word lines are generally parallel to one another and perpendicular to the Bit lines. Each of the memory cells forms a node of the array, and each node is connected to a particular pair of Word lines and Bit lines. In operation, each memory cell may be individually accessed by energizing a particular pair of Word lines and Bit lines while floating or oppositely biasing the rest of the Word lines and Bit lines.

The conventional arrangement of the memory array, however, cannot accommodate more than one memory cell per node. If the memory array includes two memory cells per node that are connected to a pair of Word lines and Bit lines, energizing the pair of Word lines and Bit lines would simultaneously energize the two parallel memory cells. Thus, the two memory cells may not be individually addressed or accessed. Accordingly, certain improvements to the memory arrays may be needed to accommodate more than one memory cell per node.

BRIEF DESCRIPTION OF THE DRAWINGS

FIG. 3 is a top view of the non-orthogonal memory array in FIG. 2 in accordance with embodiments of the technology.

FIGS. 5A-5K are top and cross-sectional views of a portion of a substrate material undergoing a process useful for forming several embodiments of the non-orthogonal memory array of FIG. 2 in accordance with embodiments of the technology.

FIGS. 8A-8F are top and cross-sectional views of a portion of a semiconductor substrate undergoing a process useful for forming several embodiments of the orthogonal memory array of FIG. 7 in accordance with embodiments of the technology.

DETAILED DESCRIPTION

Several embodiments of the present technology are described below with reference to memory arrays and associated methods of manufacturing. Many details of certain embodiments are described below with reference to semiconductor substrates. The term "semiconductor substrate" is used throughout to include a variety of articles of manufacture, including, for example, individual integrated circuit dies, sensor dies, and/or dies having other semiconductor features. Several of the processes described below may be used to form memory arrays on a wafer or a portion of a wafer. The wafer or wafer portion (e.g., wafer form) can include an unsingulated wafer or wafer portion, or a repopulated carrier wafer. The repopulated carrier wafer can include singulated elements (e.g., dies) surrounded by an adhesive material (e.g., a flexible adhesive) and a generally rigid frame. Many specific details of certain embodiments are set forth in FIGS. 1-8F and in the following text to provide a thorough understanding of these embodiments. Several other embodiments can have configurations, components, and/or processes different than those described in this disclosure. A person skilled in the relevant art, therefore, will appreciate that additional embodiments may be practiced without several of the details of the embodiments shown in FIGS. 1-8F.

Figure 1A:
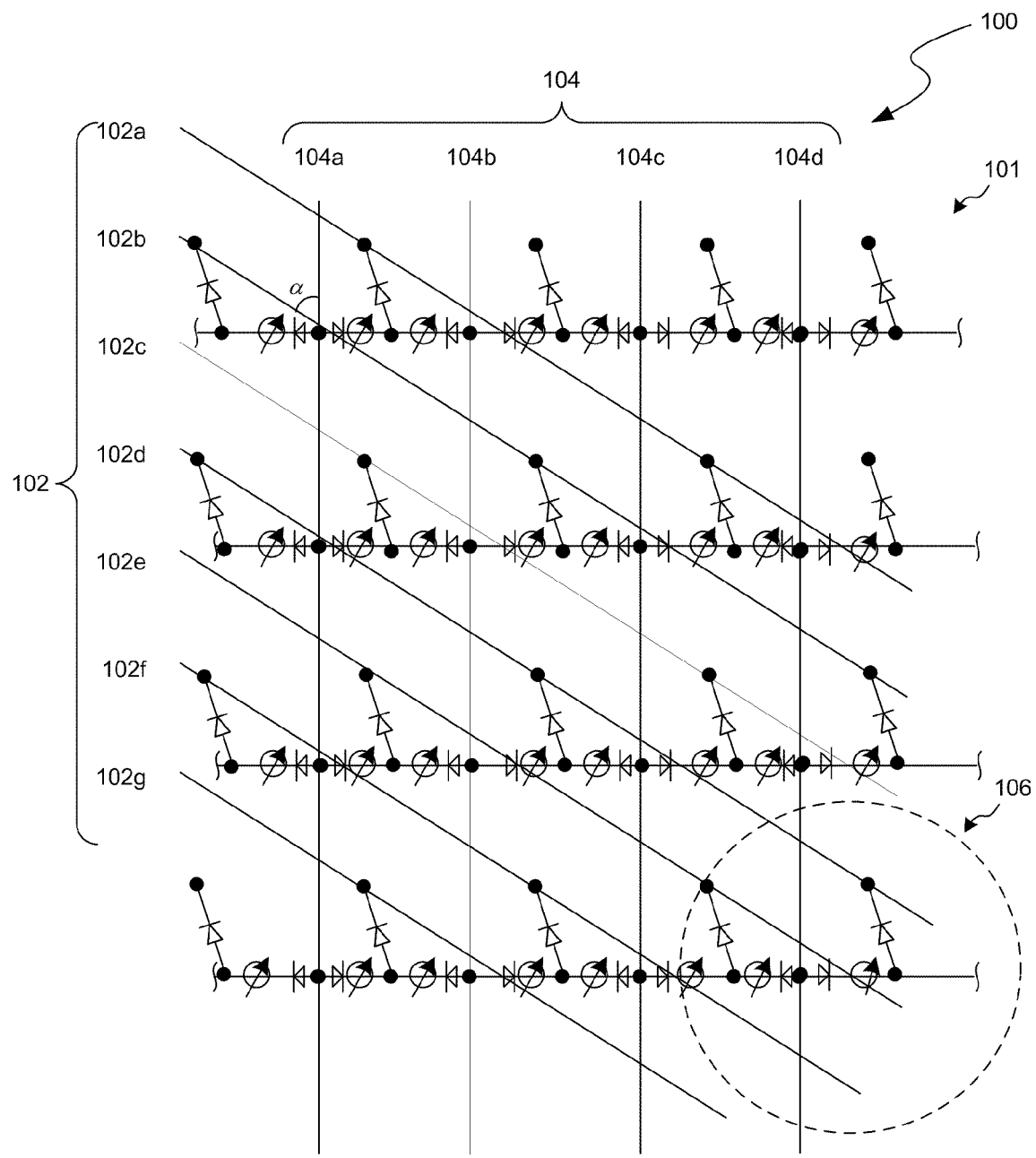
FIG. 1A is a schematic circuit diagram of a non-orthogonal memory array in accordance with embodiments of the technology.
Figure 1B:
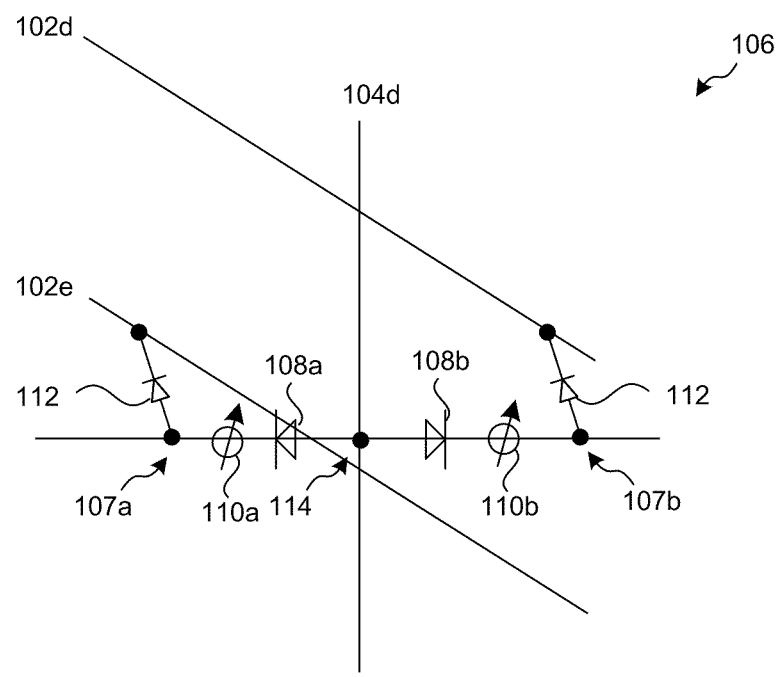
FIG. 1B is a schematic circuit diagram of a memory node in the non-orthogonal memory array of FIG. 1A.

FIG. 1A is a schematic circuit diagram of a portion of a non-orthogonal memory array 100 in accordance with several embodiments of the technology, and FIG. 1B is a schematic circuit diagram of a memory node 106 in the non-orthogonal memory array of FIG. 1A. As used herein, the term "orthogonal" generally describes a positional relationship that is perpendicular. The term "non-orthogonal" generally describes a positional relationship that is oblique or canted. As shown in FIG. 1, the memory array 100 can include a grid 101 and a plurality of memory nodes 106 carried by the grid 101. Even though only certain components of the memory array 100 are shown in FIG. 1A, in certain embodiments the memory array 100 may also include peripheral circuits, registers, and/or other suitable components.

The grid 101 can include a plurality of contact lines 102 and a plurality of access lines 104. The contact lines 102 are generally parallel to one another, and the access lines 104 are generally parallel to one another. In the illustrated embodiment, the contact lines 102 include first to seventh contact lines 102a-102g, and the access lines 104 include first to fourth access lines 104a-104d. In other embodiments, the contact and access lines 102 and 104 may include a greater or smaller number of lines.

The contact and access lines 102 and 104 can be non-orthogonal relative to one another. In the illustrated embodiment, the individual contact and access lines 102 and 104 are at an angle α of about 63°. In other embodiments, the individual contact and access lines 102 and 104 can be at other suitable angles based on the dimensions and/or relative arrangements of the contact and access lines 102 and 104, as discussed in more detail below with reference to FIG. 3. In further embodiments, the contact and access lines 102 and 104 can also be generally orthogonal while configured to accommodate the memory nodes 106 with two memory cells, as discussed in more detail below with reference to FIGS. 6-8F.

The memory nodes 106 are individually connected to the contact and access lines 102 and 104. As shown in FIG. 1B, the individual memory nodes 106 can include a first rectifier 108a, a first memory cell 110a, a second memory cell 110b, and a second rectifier 108b connected to one another in series. The input terminals of the first and second rectifiers 108a and 108*b* form an input point 114 electrically coupled to a corresponding second access line 104. The output terminals of the first and second rectifiers 108*a* and 108*b* are electrically connected to the corresponding first and second memory cells 110*a* and 110*b*, respectively. In the illustrated embodiment, the first and second rectifiers 108*a* and 108*b* each include a diode. In other embodiments, the first and second rectifiers 108*a* and 108*b* can also include a bipolar transistor, a junction field effect transistor ("JFET"), a metal oxide field effect transistor ("MOSFET"), and/or other suitable types of rectifying device.

The first and second memory cells 110*a* and 110*b* (collectively referred to as "memory cells 110") can include any suitable memory cell configurations. For example, in a particular embodiment, the memory cells 110 can include a phase change random access memory ("PCRAM") component constructed from chalcogenide glass, as described in more detail below with reference to FIGS. 4A and 4B. In one embodiment, the PCRAM structure is switchable between two states. In other embodiments, the PCRAM structure may be switchable between four, eight, or another number of states. In further embodiments, the memory cells 110 can include a floating gate transistor and/or other suitable types of memory structures.

The memory nodes 106 can include a first output point 107*a* and a second output point 107*b* electrically connected to corresponding contact lines 102 (e.g., fourth and fifth contact lines 102*d* and 102*e*, respectively, as shown in FIG. 1B) via optional third rectifiers 112. In the illustrated embodiment, the third rectifier 112 includes a diode. In other embodiments, the third rectifier 112 can also include a bipolar transistor, a JFET, a MOSFET, and/or other suitable types of rectifying device. In further embodiments, the third rectifier 112 may be omitted, and a direct electrical link (e.g., a metal trace, a metal wire, and/or other conductive coupler) may directly connect the output points 107*a* and 107*b* to the corresponding contact lines.

One feature of several embodiments of the memory array 100 is that the memory cells 110 in the memory nodes 106 are individually connected to different pairs of the contact and access lines 102 and 104 to form different circuits. For example, as shown in FIG. 1B, the first memory cell 110*a* is connected between fourth access line 104*d* and the fifth contact line 102*e* forming a first circuit. The second memory cell 110*b* is connected to the fourth access line 104*d* and the fourth contact line 102*d* forming a second circuit. The first and second circuits are electrically isolated from each other.

The foregoing feature allows each of the memory cells 110 in the individual memory nodes 106 to be individually addressed or accessed. For example, the first and second memory cells 110*a* and 110*b* of the memory node 106 may be individually accessed by energizing (1) the fourth access line 104*d* and the fourth contact line 102*d* or (2) the fourth access line 104*d* and the fifth contact line 102*e*. As shown in FIG. 1B, to access the first memory cell 110*a*, the fourth access line 104*d* and the fifth contact line 102*e* may be energized (e.g., by reversing the polarity relative to other access lines). As a result, electrical current may flow between the fourth access line 104*d* and the fifth contact line 102*e* via a path formed by the input point 114, the first rectifier 108*a*, the first memory cell 110*a*, the first output point 107*a*, and the optional third rectifier 112. Thus, the state and/or other information stored in the first memory cell 110*a* may be altered or accessed. While accessing the first memory cell 110*a*, the second memory cell 110*b* can retain its current state because the fourth contact line 102*d* is reversely biased or kept floating. After the first memory cell 110*a* is accessed, the second memory cell 110*b* may be accessed by energizing the fourth access line 104*d* and the fourth contact line 102*d* while reversely biasing or floating the fifth contact line 102*e*.

Figure 2:
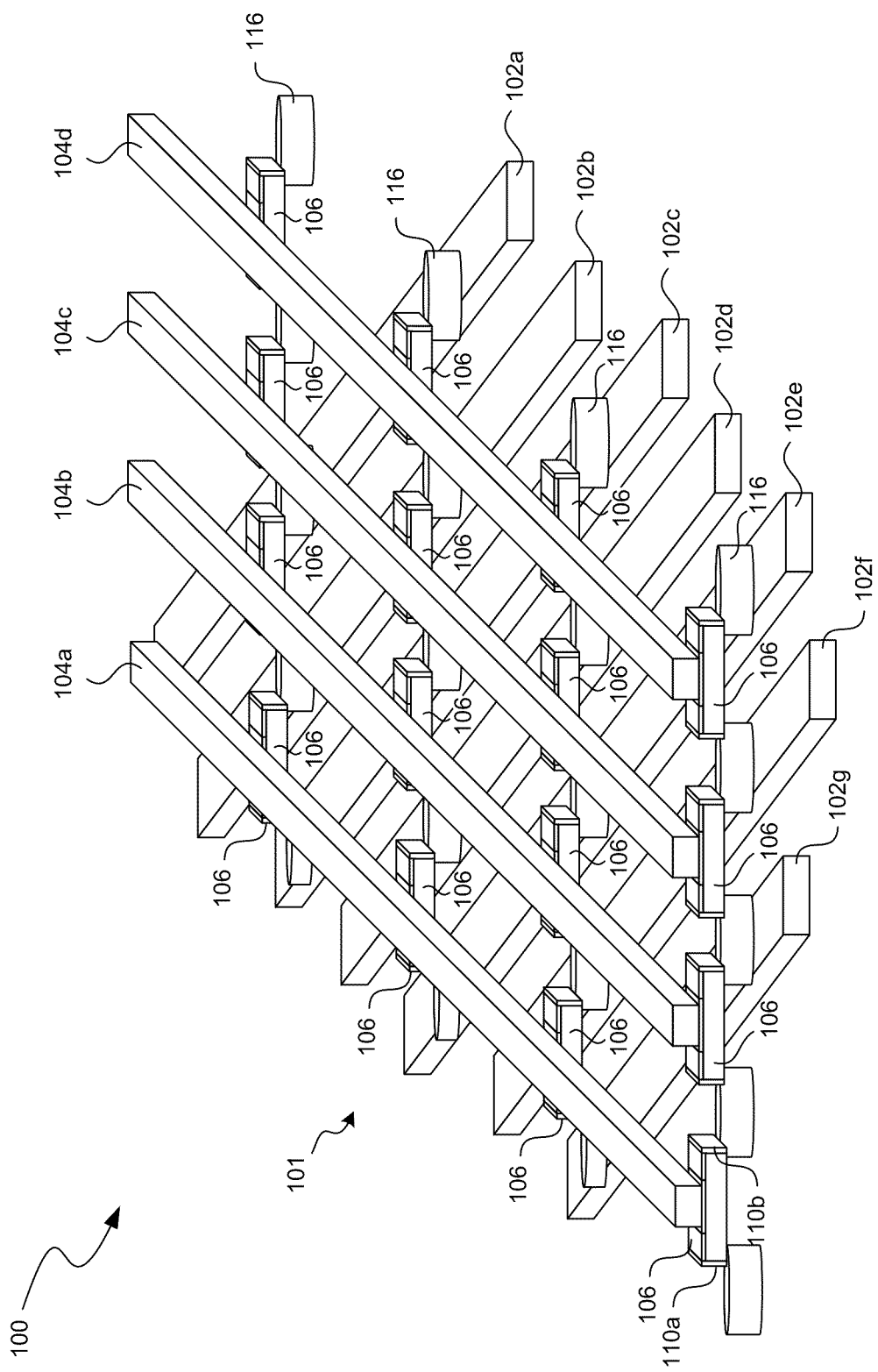
FIG. 2 is a perspective view of one implementation of the non-orthogonal memory array in FIG. 1 in accordance with embodiments of the technology.

FIG. 2 is a perspective view of one implementation of the non-orthogonal memory array 100 in FIG. 1, and FIG. 3 is a top view of the non-orthogonal memory array 100 in FIG. 2 in accordance with embodiments of the technology. In FIGS. 2 and 3, inter-component insulation of the memory array 100 is removed for clarity.

Referring to both FIGS. 2 and 3 together, the memory array 100 can include a plurality of contact lines 102, a plurality of memory nodes 106 in direct contact with and stacked on the contact lines 102 via a plurality of conductive contacts 116, and a plurality of access lines 104 in direct contact with the memory nodes 106. The contact and access lines 102 and 104 can be at an angle α based on a first distance a between two adjacent contact lines 102 and a second distance b between two access lines 104. For example, the angle α may be determined according to the following formula:

$$\alpha = \arctan\left(\frac{b}{a}\right)$$

In other embodiments, the value of a may be determined based on other suitable dimensions and/or conditions.

The individual contact and access lines 102 and 104 can include a trace, a channel, and/or other suitable structure constructed from doped polysilicon, a metal, a metal alloy, and/or other suitable materials. The conductive contacts 116 can include a volume of a metal (e.g., copper, aluminum, or gold), a metal alloy (e.g., solder), and/or other suitable conductive materials. The memory nodes 106 can include two memory cells 110*a* and 110*b*, as described in more detail below with reference to FIGS. 4A and 4B. Even though the contact and access lines 102 and 104 are shown as having generally rectangular shapes, in other embodiments the contact and access lines 102 and 104 may include curves, apertures, steps, and/or other structural features.

Figure 4A:
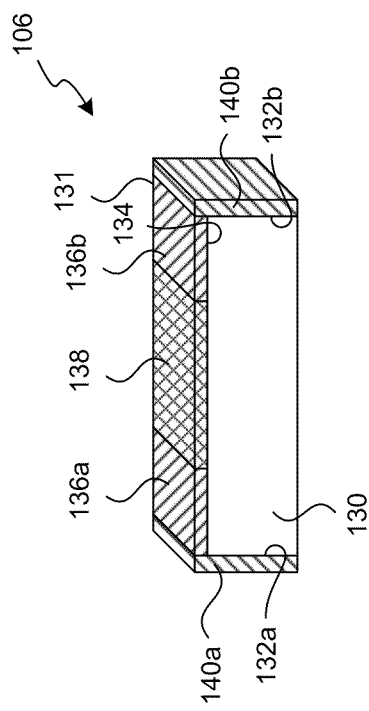
FIG. 4A is a perspective view of a two-cell memory sub-assembly useful for the non-orthogonal memory array in FIG. 2 in accordance with embodiments of the technology.

FIG. 4A is a perspective view of a two-cell memory node 106 useful for the non-orthogonal memory array 100 in FIG. 2 in accordance with embodiments of the technology. As shown in FIG. 4A, the memory node 106 includes a generally rectangular memory dielectric 130 having a first sidewall 132*a*, a second sidewall 132*b*, and a top wall 134 between the first and second sidewalls 132*a* and 132*b*. The memory dielectric 130 can include silicon dioxide, silicon nitride, and/or other suitable insulation materials.

The memory node 106 can also include a doped material 131 on the top wall 134 of the memory dielectric 130. In the illustrated embodiment, the doped material 131 includes a first N-type region 136*a*, a second N-type region 136*b*, and a P-type region 138 therebetween. The P-type region 138 is between the first and second N-type regions 136*a* and 136*b* to form two back-to-back P/N junctions as the first and second rectifiers 108*a* and 108*b* (FIG. 1). Even though two N-type regions are illustrated in FIG. 4A, in certain embodiments, the memory node 106 may include two P-type regions separated by one N-type region. In further embodiments, the memory node 106 may include other components and/or structures for forming a JFET, a MOSFET, and/or other suitable rectifiers.

The memory node 106 also includes a first memory structure 140*a* in direct contact with the first sidewall 132*a*, and a second memory structure 140*b* in direct contact with the second sidewall 132*b*. In one embodiment, the first and second memory structures 140*a* and 140*b* (collectively referred to as "memory structures 140") can include a layer of chalcogenide glass. In other embodiments, the memory structures 140 may include a floating gate transistor and/or other suitable materials and/or structures.

Figure 4B:
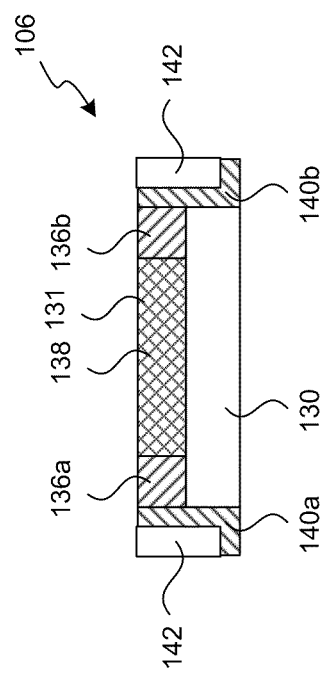
FIG. 4B is a cross-sectional view of another two-cell memory sub-assembly useful for the non-orthogonal memory array in FIG. 2 in accordance with embodiments of the technology.

Even though the memory structures 140 are shown as being generally rectangular, in other embodiments, the memory structures 140 may have other configurations. For example, as shown in FIG. 4B, the first and second memory structures 140a and 140b have an L shape and are in direct contact with an insulating material 142 (e.g., silicon oxide). In further embodiments, the memory structures 140 may have other suitable configurations.

FIGS. 5A-5K are top and cross-sectional views of a portion of a semiconductor substrate material 150 undergoing a process useful for forming several embodiments of the non-orthogonal memory array 100 of FIG. 2 in accordance with embodiments of the technology. In the illustrated embodiment, the substrate material 150 includes a P-type dopant for illustration purposes. One of ordinary skill in the art would understand that the substrate material 150 may also include an N-type dopant or that it may be intrinsic (i.e., not doped).

Figure 5A:
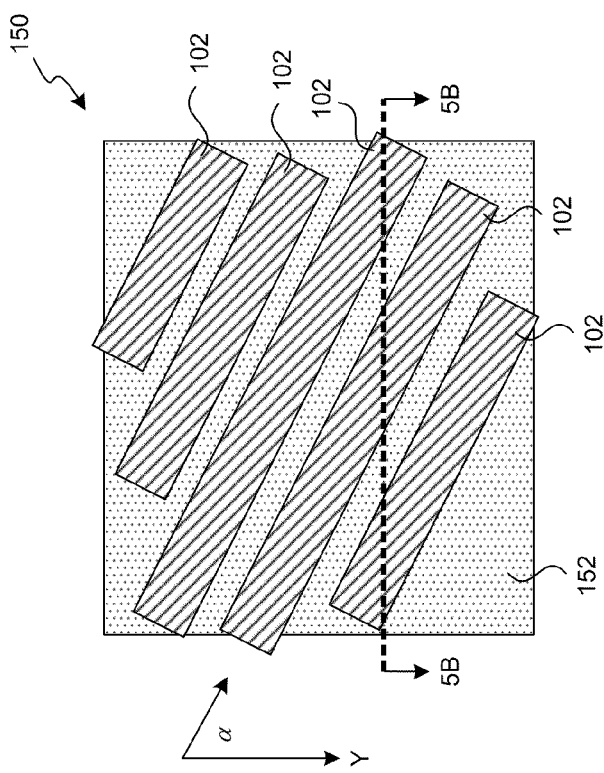
Figure 5B:
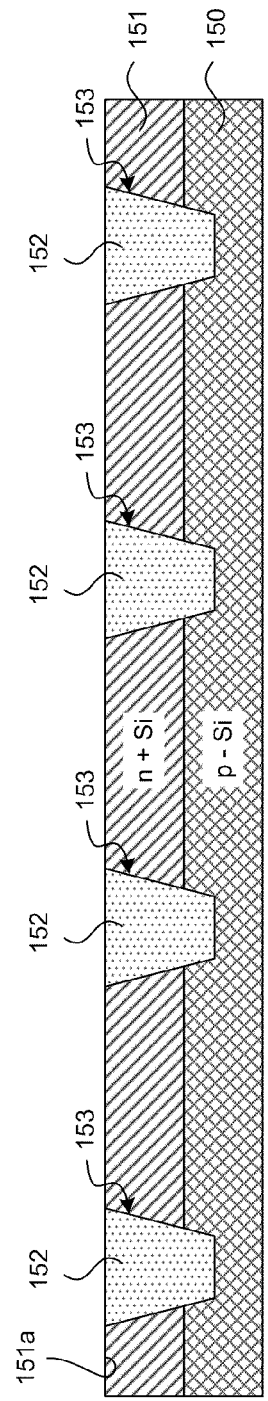

FIGS. 5A and 5B are top and cross-sectional views of the substrate material 150 during an initial stage of the process in which the contact lines 102 are formed. As shown in FIGS. 5A and 5B, an N-type silicon material 151 can be blanket-deposited onto the substrate material 150 using chemical vapor deposition (CVD), plasma-enhanced chemical vapor deposition (PECVD), atomic layer deposition (ALD), and/or another suitable technique, or may be formed by counterdoping the P-type silicon substrate.

Subsequently, a photoresist (not shown) may be deposited on the N-type silicon material 151 via spin coating or another suitable deposition technique. The photoresist may then be patterned to form a plurality of trenches. The term "patterning" as used hereinafter generally refers to the process of printing a desired pattern on a photoresist and subsequently removing certain portions of the photoresist to form the desired pattern in the photoresist using photolithography and/or another suitable technique.

With the patterned photoresist, portions of the N-type silicon material 151 may be removed to form first trenches 153. Suitable removal techniques can include wet etching, dry etching, reactive ion etching, and/or other suitable techniques. In the illustrated embodiment, the first trenches 153 extend through the N-type silicon material 151 into the substrate material 150. In other embodiments, the first trenches 153 extend through the N-type silicon material 151 to interface with the substrate material 150. In further embodiments, the first trenches 153 extend partially through the N-type silicon material 151 without reaching the substrate material 150.

After partially removing the N-type silicon material 151, the first trenches 153 may be filled with an insulation material to isolate the contact lines 102. For example, in one embodiment, a blanket insulation material 152 (e.g., silicon oxide) may be deposited onto the substrate material 150 and then removed to expose the top surface 151a of the N-type silicon material 151. Suitable removal techniques include chemical mechanical polishing, electro-chemical mechanical polishing, and/or other suitable techniques.

Figure 5C:
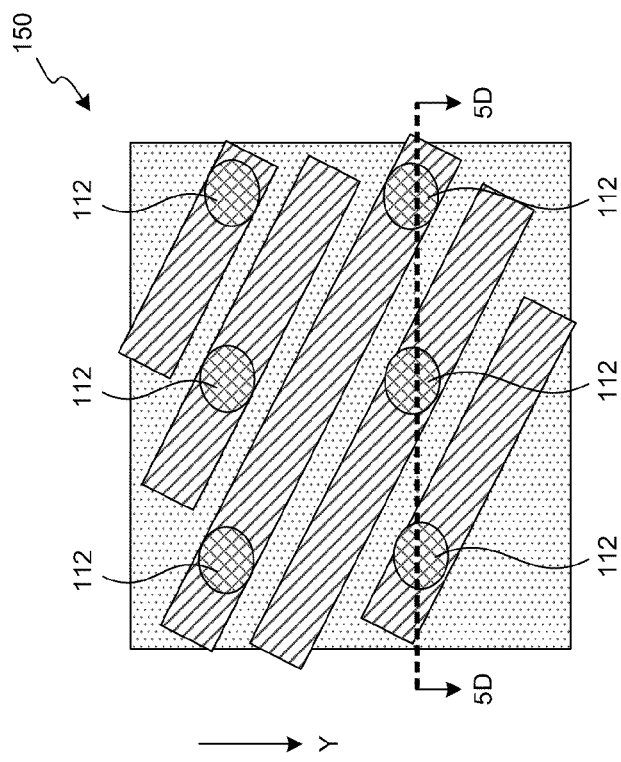
Figure 5D:
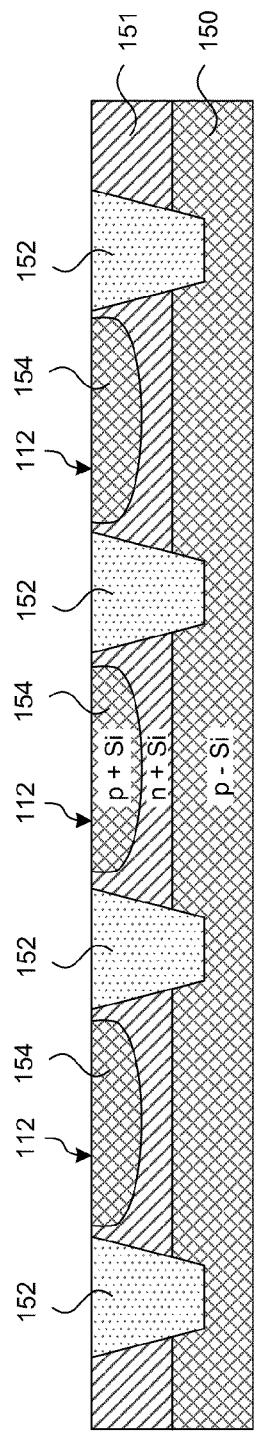

FIGS. 5C and 5D are top and cross-sectional views of the substrate material 150 during an optional stage of the process in which the optional third rectifiers 112 are formed. Referring to both FIGS. 5C and 5D, the third rectifiers 112 can be formed by first patterning the substrate material 150 with a photoresist (not shown) to identify the desired implantation areas. Then, a P-type dopant can be implanted using diffusion, ion implantation, and/or another suitable technique. In one embodiment, the P-type dopant can have a concentration higher than that of the substrate material 150. In other embodiments, the P-type dopant may have other desired concentrations.

Figure 5E:
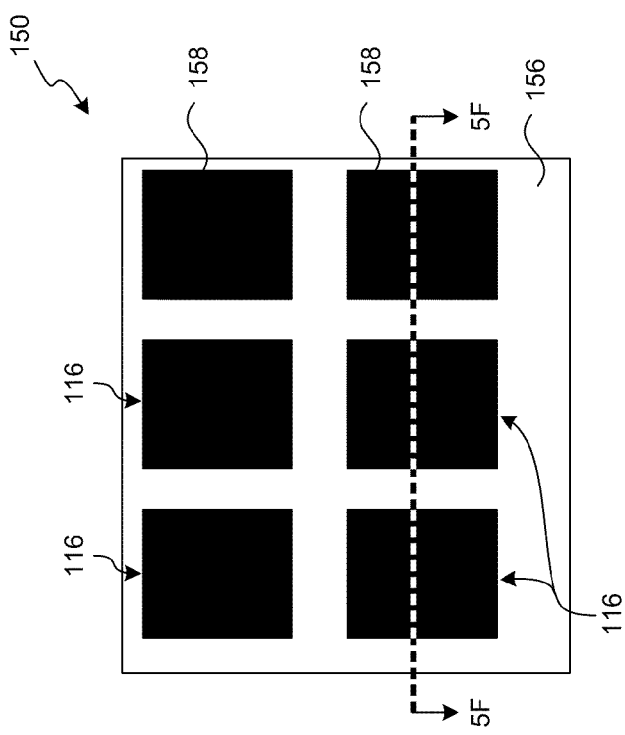
Figure 5F:
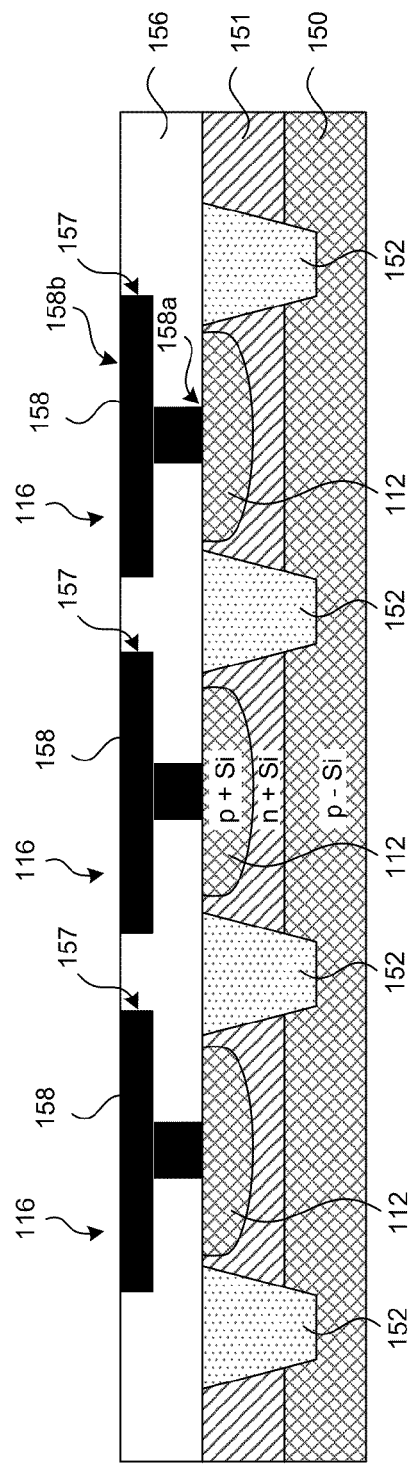

FIGS. 5E and 5F are top and cross-sectional views of the substrate material 150 during another stage of the process in which the conductive contacts 116 are formed. Referring to both FIGS. 5E and 5F, a contact dielectric 156 can be deposited onto the substrate material 150. The contact dielectric 156 can then be patterned with a photoresist and partially removed to form a plurality of second trenches 157. In the illustrated embodiment, the second trenches 157 have a T shape with a first end 158a in direct contact with the optional third rectifier 112 and a second end 158b generally planar with the contact dielectric 156. In other embodiments, the second trenches 157 can have a rectangular, oval, partially spherical, and/or another suitable type of shape. After forming the second trenches 157, a conductive material 158 can be deposited onto the contact dielectric 156 and subsequently polished to fill the second trenches 157. The conductive material 158 can include tungsten, copper, aluminum, gold, and/or another suitable material.

FIGS. 5G and 5H are top and cross-sectional views of the substrate material 150 during another stage of the process in which a plurality of memory nodes 106 are formed. During this stage, the memory dielectric 130 and an N-type material 136 can be deposited in a series onto a top surface 156a of the contact dielectric 156. Subsequently, the N-type material 136 may be patterned with a photoresist (not shown) and doped with a P-type dopant to form the P-type regions 138 between the first and second N-type regions 136a and 136b.

After forming the P-type regions 138, the process can then include patterning the N-type material 136 and removing portions of the N-type material 136 and the memory dielectric 130 to form columns 160 as shown in FIG. 5G. Each of the columns 160 can have a first sidewall 160a, a second sidewall 160b, and a top wall 160c therebetween. The first and second sidewalls 160a and 160b individually correspond to a pair of adjacent conductive contacts 116.

Subsequently, a conformal memory structure 140 may be deposited on the columns 160 and the top surface 156a of the contact dielectric 156. Then, the memory structure 140 may be spacer etched and/or otherwise selectively removed to form the first and second memory structures 140a and 140b on the first and second sidewalls 160a and 160b of the columns 160, respectively. Then, the columns 160 may be patterned and etched to form individual memory nodes 106, as shown in FIG. 5J.

Figure 5I:
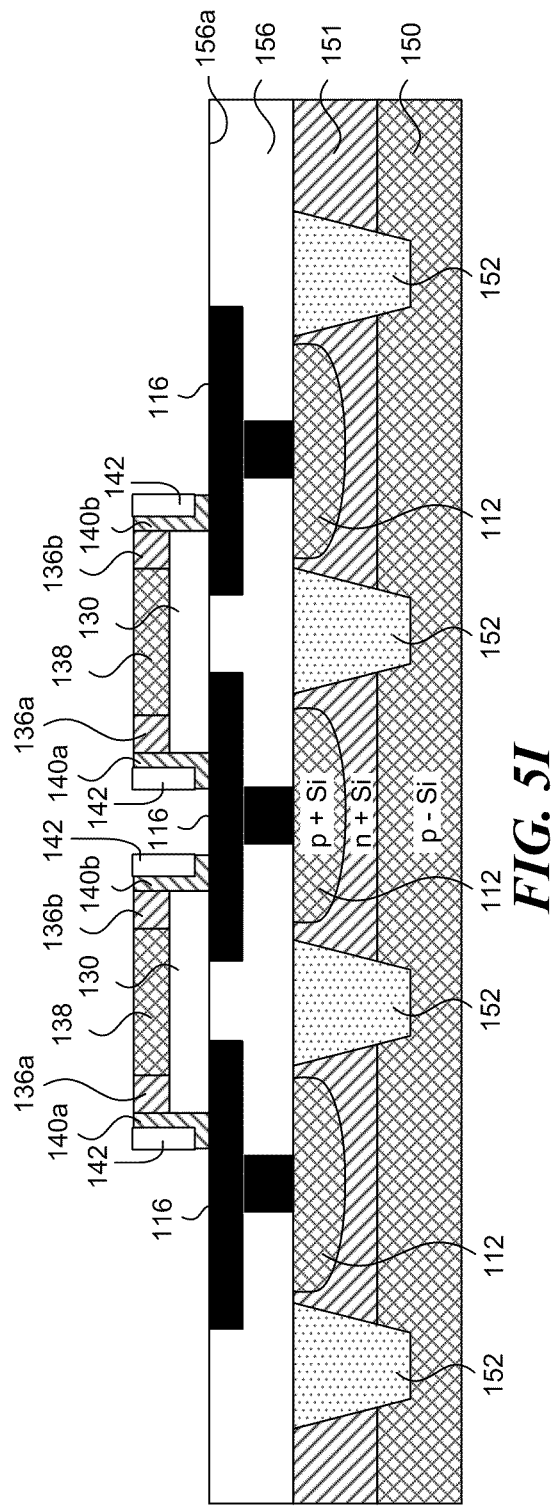

Even though the foregoing description discusses forming the memory structures 140 as shown in FIG. 4A, in certain embodiments, the process can include stages for forming the memory structures 140 as shown in FIG. 4B. As shown in FIG. 5I, the process can include depositing a conformal layer of the memory structure 140 onto the columns 160 and the top surface 156a of the contact dielectric 156. Then, the insulating material 142 may be deposited onto the memory structure 140 and polished to expose the columns 160. The insulating material 142 and the memory structure 140 can then be spacer-etched together to form L-shaped memory structures 140.

Figure 5J:
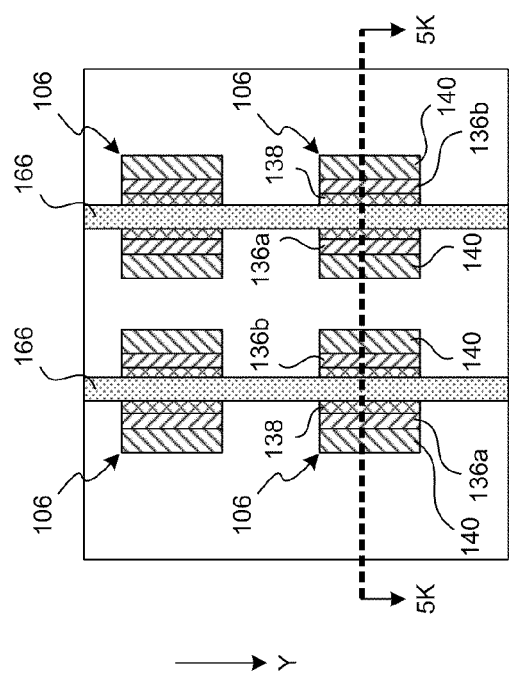
Figure 5K:
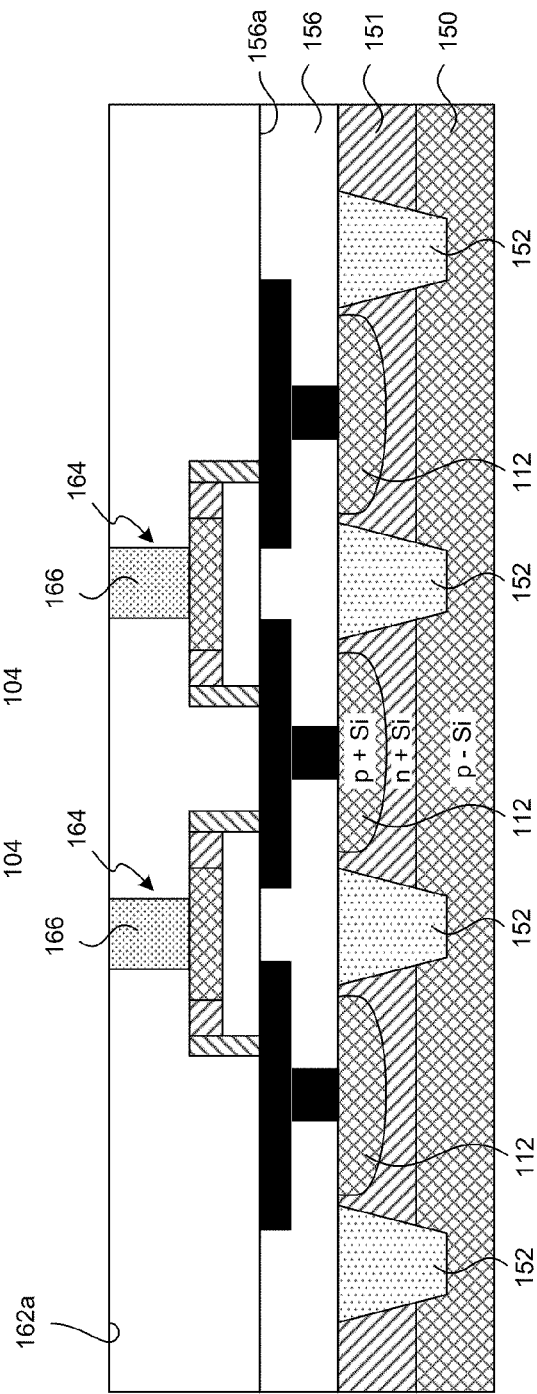

FIGS. 5J and 5K are top and cross-sectional views of the substrate material 150 during another stage of the process in which the access lines 104 are formed. As shown in FIG. 5K, an access dielectric 162 may be deposited onto the contact dielectric 156 and the memory nodes 106 and polished to form a generally flat surface 162a. As shown in FIG. 5J, the access dielectric 162 may be patterned and etched to form third trenches 164 exposing the P-type regions 138 of the individual memory nodes 106. Subsequently, a conductive material 166 (e.g., copper) can be deposited in the third trenches 164 and on the top surface 162a of the access dielectric 162. The deposited conductive material 166 can then be polished such that only those portions in the third trenches 164 remain, thus forming the access lines 104.

Figure 6:
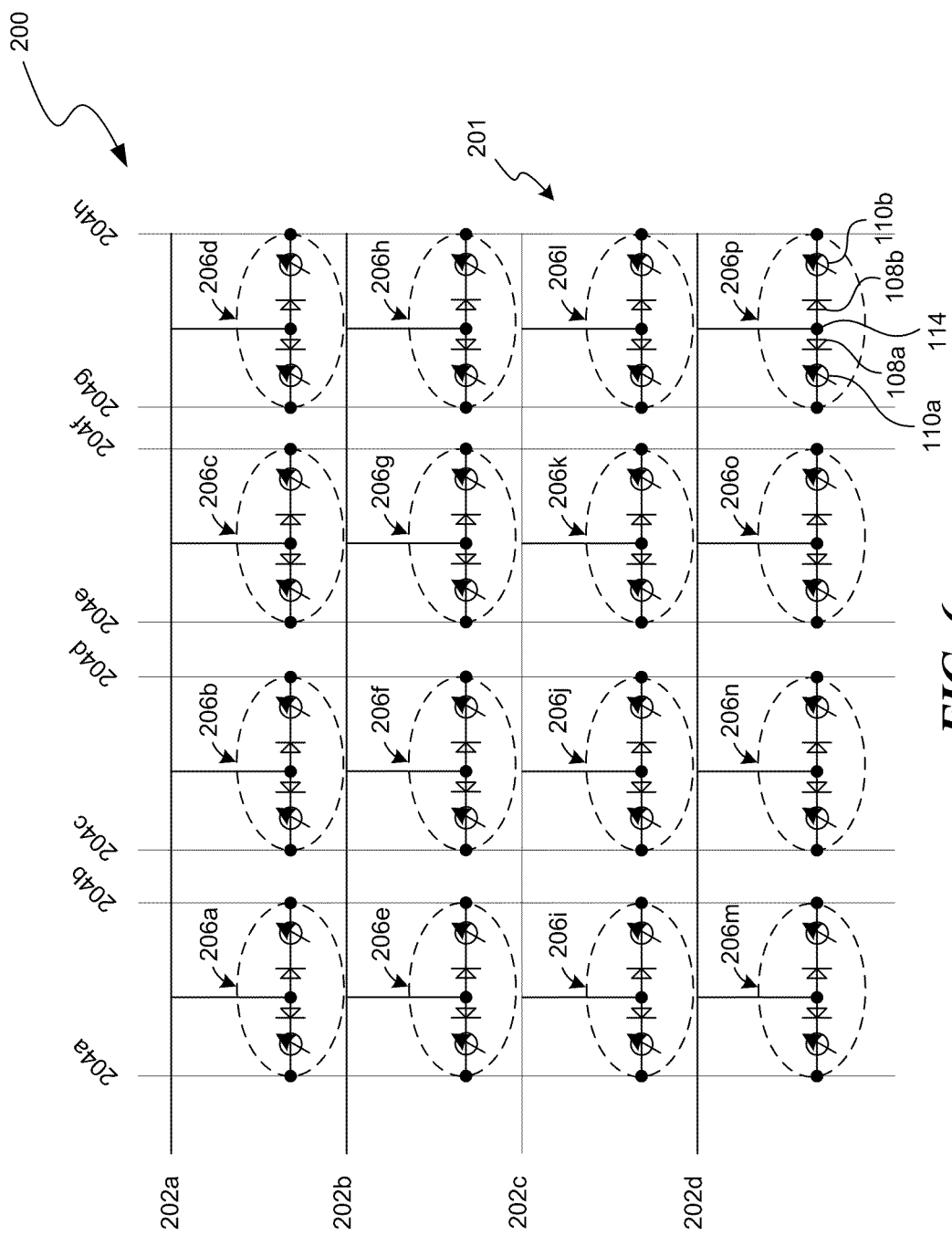
FIG. 6 is a schematic circuit diagram of an orthogonal memory array configured to accommodate multiple memory cells per node in accordance with other embodiments of the technology.
Figure 7:
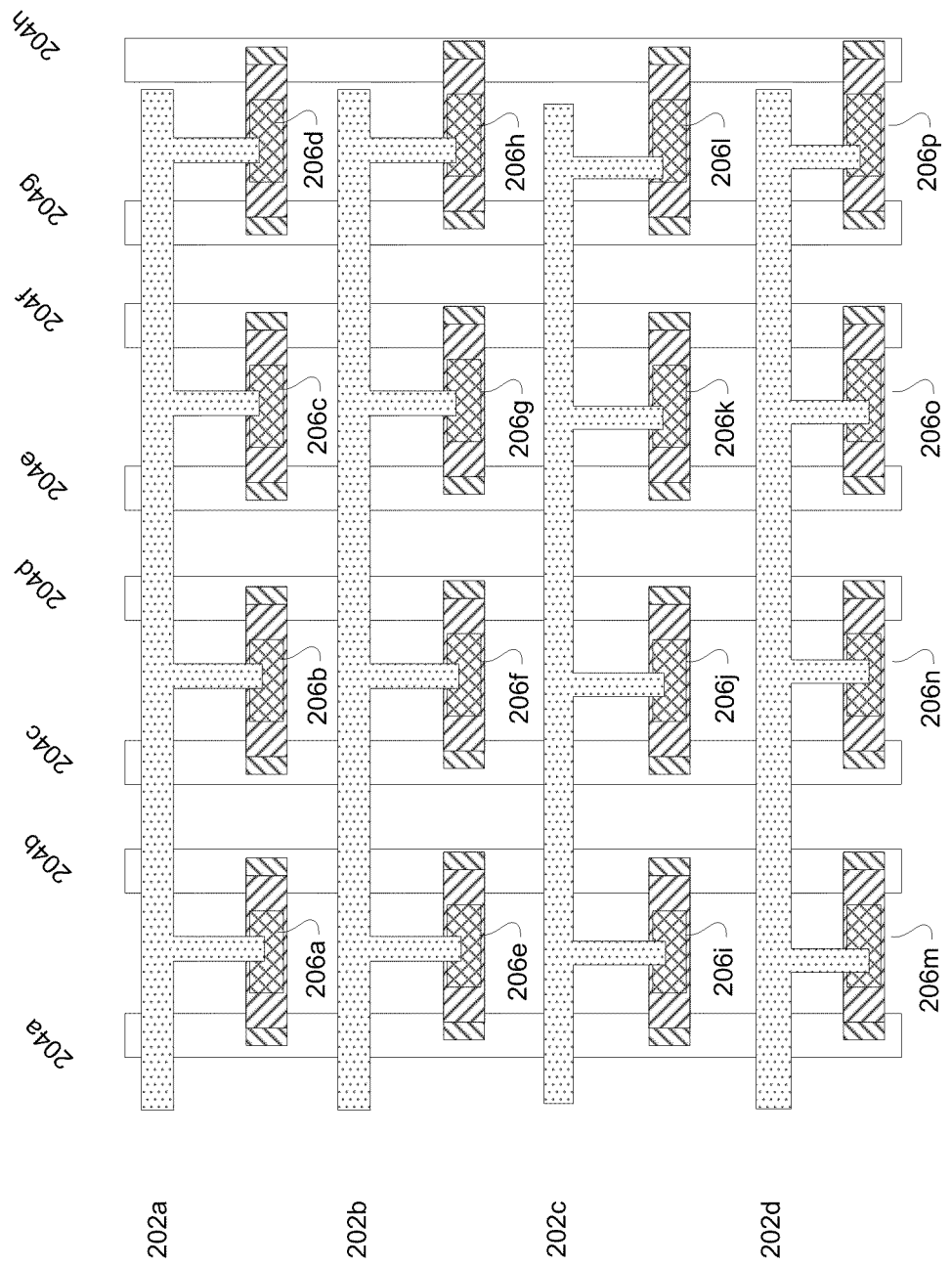
FIG. 7 is a top view of one implementation of the orthogonal memory array in FIG. 6 in accordance with embodiments of the technology.

FIG. 6 is a schematic circuit diagram of a portion of an orthogonal memory array 200, and FIG. 7 is a top view of one implementation of the memory array 200 in FIG. 6 in accordance with embodiments of the technology. The memory array 200 can include components that are generally similar in structure and function to those of the memory array 100 in FIG. 1. As such, similar identification numbers generally refer to similar structure and/or components.

Referring to both FIGS. 6 and 7, the memory array 200 can include a grid 201 and a plurality of memory nodes 206 (identified individually as first to sixteenth memory nodes 206a-206p, respectively) carried by the grid 201. The grid 201 can include a plurality of first access lines 202 (identified individually as first to fourth contact lines 202a-202d, respectively) and a plurality of second access lines 204 (identified individually as first to eighth access lines 204a-204h, respectively). The first and second access lines 202 and 204 can be generally orthogonal relative to one another. The first and second access lines 202 and 204 can include a generally conductive trace constructed from a metal, a metal alloy, doped semiconductor material, and/or other suitable materials.

The memory nodes 206 are individually connected to the first and second access lines 202 and 204. As shown in FIG. 6, an individual memory node 106 can include a first memory cell 110a, a first rectifier 108a, a second rectifier 108b, and a second memory cell 110b connected to one another in a series. The input terminals of the first and second rectifiers 108a and 108b share an input point 114 that is electrically connected to corresponding first access lines 202. The output terminals of the first and second rectifiers 108a and 108b are electrically connected to the first and second memory cells 110a and 110b, which are in turn connected to corresponding second access lines 204, respectively.

Any of the memory nodes 206 that share a common first access line 202 do not share a common second access line 204. For example, the first memory node 206a and the second memory node 206b are both connected to the first access line 202a. However, these two memory nodes 206a and 206b do not share a common second access line 204. Instead, the first memory node 206a is connected to the first and second access lines 204a and 204b while the second memory node 206b is connected to the third and fourth access lines 204c and 204d.

In operation, each of the memory cells 110 in the individual memory nodes 206 may be addressed or accessed by energizing a pair of corresponding first and second access lines 202 and 204. For example, the memory cells 110 of the tenth memory node 206j may be accessed by energizing the first access line 202c and one of the second access lines 204c and 204d. As shown in FIG. 6, the first access line 202c and the second access line 204c are energized (as indicated by the thickened lines) by having reversed polarity relative to other first and second access lines 202 and 204. As a result, electrical current flows from the first access line 202c via the connection node 114, the first rectifier 108a, and the first memory cell 110a to the second access line 204c. As a result, the state and/or other information stored in the first memory cell 110a may be changed or read. While accessing the first memory cell 110a, the second memory cell 110b is not altered because the second access line 204d connected to the second memory cell 110b is biased with the same polarity as the first access line 202c. After the first memory cell 110a is accessed, the second memory cell 110b may be accessed by energizing the first access line 202c and the second access line 204d. As a result, electrical current flows from the first access line 202c via the connection node 114, the second rectifier 108b, and the second memory cell 110b to the second access line 204d.

FIGS. 8A-8F are top and cross-sectional views of a portion of a semiconductor substrate material 250 undergoing a process useful for forming several embodiments of the orthogonal memory array 200 of FIG. 6 in accordance with embodiments of the technology. In the illustrated embodiment, the substrate material 250 includes a P-type dopant for illustration purposes. One of ordinary skill in the art would understand that the substrate material 250 may also include an N-type dopant or that the substrate material 250 may also be not doped.

Figure 8A:
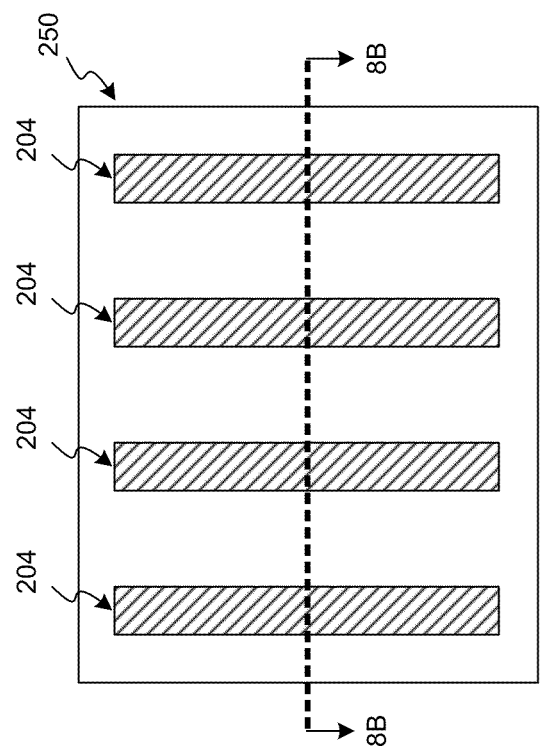
Figure 8B:
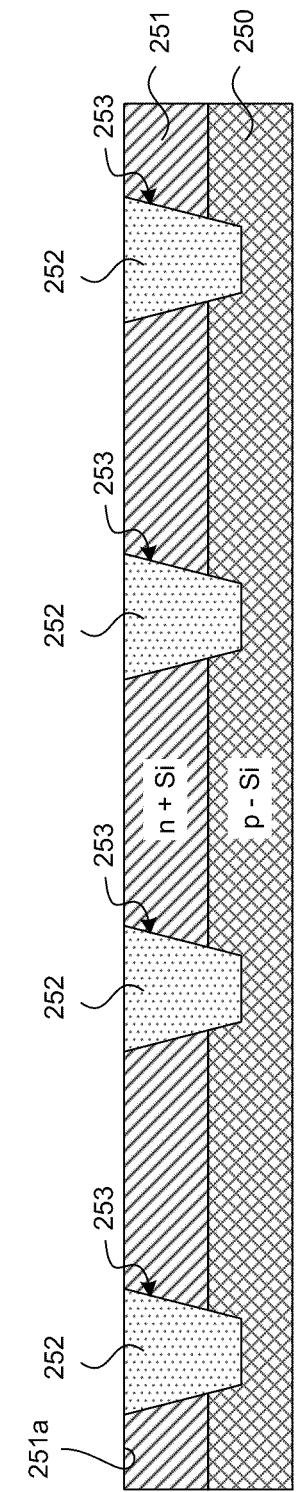

FIGS. 8A and 8B are top and cross-sectional views of the substrate material 150 during an initial stage of the process in which the second access lines 204 are formed. As shown in FIGS. 8A and 8B, an N-type silicon material 251 can be blanket-deposited onto the substrate material 250 using chemical vapor deposition (CVD), plasma-enhanced vapor deposition (PEVD), and/or another suitable technique, or by counterdoping the P-type substrate with N-type dopants. Subsequently, the N-type silicon material 251 can be patterned using photolithography and partially removed to form a plurality of first trenches 253.

In the illustrated embodiment, the first trenches 253 extend through the N-type silicon material 251 into the substrate material 250. In other embodiments, the first trenches 253 extend through the N-type silicon material 251 to interface with the substrate material 250. In further embodiments, the first trenches 253 extend partially through the N-type silicon material 251 without reaching the substrate material 250. After partially removing the N-type silicon material 251, the first trenches 253 may be filled with an insulation material to isolate the contact lines 102 (not shown). For example, in one embodiment, a blanket insulation material 252 may be deposited onto the substrate material 250 and then removed to expose the top surface 251a of the N-type material 251.

Figure 8C:
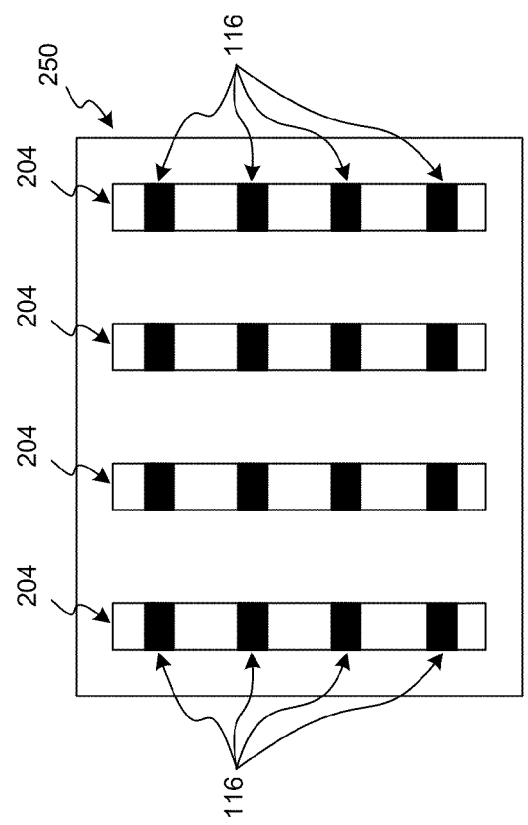
Figure 8D:
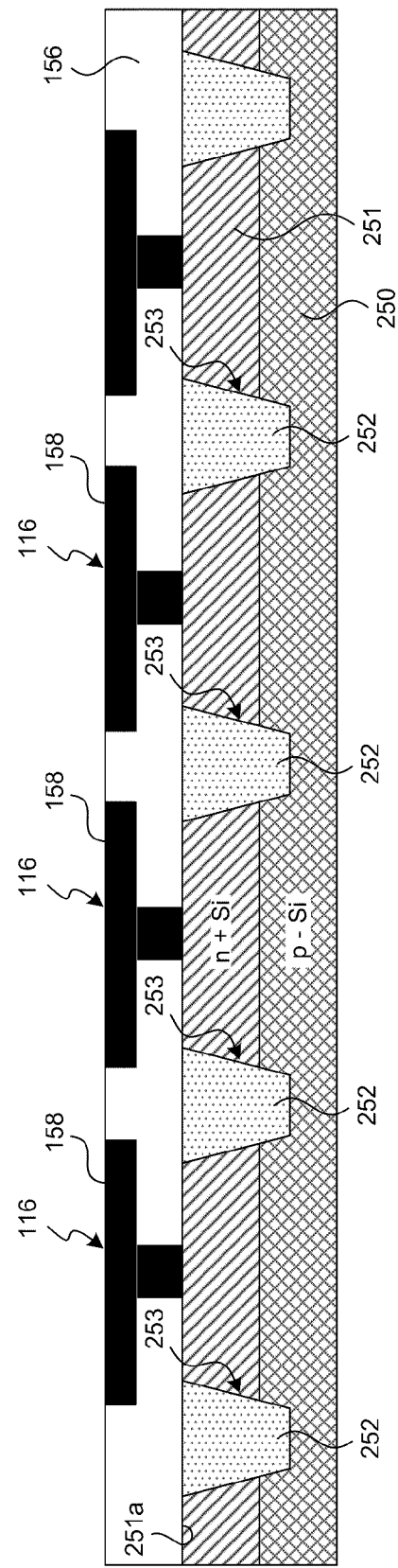

FIGS. 8C and 8D are top and cross-sectional views of the substrate material 150 during another stage of the process in which the conductive contacts 216 are formed following a process generally similar to that discussed above with reference to FIGS. 5E and 5F. FIGS. 8E and 8F are top and cross-sectional views of the substrate material 250 during another stage of the process in which the memory nodes 206 are formed following a process generally similar to that discussed above with reference to FIGS. 5G and 5H. However, unlike the embodiment illustrated in FIGS. 5G and 5H, the individual columns 160 do not share a common conductive contact 116. Instead, each conductive contact 116 is associated with only one column 160. Subsequently, the process may include forming individual memory nodes by patterning and etching the columns 160. The process may then include forming the first access lines 202 over the formed memory nodes 106 following a process generally similar to that discussed with reference to FIGS. 5J and 5K.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:
1. A memory structure, comprising:
an access line extending along a first direction;
a first contact line and a second contact line extending along a second direction different than the first direction, the first and second contact lines being generally parallel to each other;
a memory node including:
a first memory cell electrically connected between the access line and the first contact line to form a first circuit;
a second memory cell electrically connected between the access line and the second contact line to form a second circuit electrically independent from the first circuit; and
a rectifier device between the access line and the first and second memory cells,
wherein the first and second circuits include a common circuit path through at least a portion of the rectifier device.

2. The memory structure of claim 1 wherein the first and second contact lines form an oblique angle with the access line.

3. The memory structure of claim 1 wherein
the first and second directions form an oblique angle of about 63°; and
the rectifier device of the memory node further includes:
a first rectifier having an input terminal and a first output terminal;
a second rectifier having the input terminal and a second output terminal;
the input terminal of the first and second rectifiers being electrically connected to the access line;
the first and second memory cells including chalcogenide glass;
the first memory cell being electrically connected to the first output terminal of the first rectifier and the first contact line; and
the second memory cell is electrically connected to the second output terminal of the second rectifier and the second contact line.

4. The memory structure of claim 1 wherein:
the first and second directions form an oblique angle of about 63°; and
the first and second circuits are electrically isolated from each other.

5. The memory structure of claim 1 wherein
the first and second directions form an oblique angle; and
the rectifier device of the memory node further includes:
a first rectifier having an input terminal and a first output terminal;
a second rectifier having the input terminal and a second output terminal;
the input terminal of the first and second rectifiers is electrically connected to the access line; and
the first output terminal of the first rectifier and the second output terminal of the second rectifier are electrically connected to the first and second memory cells, respectively.

6. The memory structure of claim 1, further comprising:
a first contact rectifier between the first memory cell and the first contact line; and
a second contact rectifier between the second memory cell and the second contact line.

7. The memory structure of claim 1 wherein
the first and second directions form an oblique angle;
the rectifier device of the memory node further includes:
a first rectifier having an input terminal and a first output terminal;
a second rectifier having the input terminal and a second output terminal;
the input terminal of the first and second rectifiers is electrically connected to the access line; and
the first output terminal of the first rectifier and the second output terminal of the second rectifier are electrically connected to the first and second memory cells, respectively; and
the memory structure, further comprising a first contact rectifier between the first memory cell and the first contact line; and
a second contact rectifier between the second memory cell and the second contact line.

8. The memory structure of claim 1 wherein the first and second contact lines are generally orthogonal relative to the access line.

9. The memory structure of claim 1 wherein:
the first and second contact lines are generally orthogonal relative to the access line;
the memory node further includes:
a first rectifier having a first input terminal and a first output terminal;
a second rectifier having a second input terminal and a second output terminal; and
the first input terminal of the first rectifier and the second input terminal of the second rectifier are electrically connected to the access line.

10. A memory structure, comprising:
a plurality of access lines extending along a first direction;
a plurality of contact lines extending along a second direction different from the first direction, the individual contact lines and the individual access lines forming a plurality of pairs of access and contact lines;
a plurality of memory nodes electrically connected to the access and contact lines, the individual memory nodes including:
a rectifier device including a first junction device and second junction device, wherein the first junction device includes a first doping region arranged with a second doping region to define a first junction, and wherein the second junction device includes a third doping region arranged with the second doping region to define a second junction;
a first memory cell electrically connected between a first pair of access and contact lines with the rectifier device between the first pair of access lines and the first memory cell; and
a second memory cell electrically connected between a second pair of access and contact lines with the rectifier device between the second pair of access lines and the second memory cell, the first and second pairs of access and contact lines are electrically isolated from each other, wherein the first and second memory cells are connected to the rectifier device, the same access line, and adjacent contact lines.

11. The memory structure of claim 10 wherein the contact lines form an oblique angle with the access lines.

12. The memory structure of claim 10 wherein
the rectifier device of the individual memory nodes further include:
a first rectifier having an input terminal and a first output terminal;

a second rectifier having the input terminal and a second output terminal;
the input terminal of the first and second rectifiers is electrically connected to the access line; and
the first output terminal of the first rectifier and the second output terminal of the second rectifier are electrically connected to the first and second memory cells, respectively.

13. The memory structure of claim 10, further comprising:
a first contact rectifier between the first memory cell and the individual contact lines; and
a second contact rectifier between the second memory cell and the individual contact lines.

14. The memory structure of claim 10 wherein the contact lines are generally orthogonal relative to the access lines.

15. A memory structure, comprising:
a plurality of access lines extending along a first direction;
a plurality of contact lines extending along a second direction that is non-orthogonal to the first direction such that the contact lines are canted relative to the access lines, the individual contact lines and the individual access lines forming a plurality of pairs of access and contact lines;
a plurality of memory nodes electrically connected to the access and contact lines, the individual memory nodes including:
two back-to-back junction devices that share a common doping region;
a first memory cell electrically connected between a first access line and a first contact line with the common doping back-to-back junction devices between the first access line and the first memory cell; and
a second memory cell electrically connected between the first access line and a second contact line with the common doping region of the two back-to-back junction devices between the first access line and the second memory cell.

16. The memory structure of claim 15 wherein the contact lines form an angle of about 63° with the access lines.

17. The memory structure of claim 15 wherein the back-to-back junction devices form:
a first rectifier having an input terminal and a first output terminal;
a second rectifier having the input terminal and a second output terminal;
the input terminal of the first and second rectifiers is electrically connected to the first access line; and
the first output terminal of the first rectifier and the second output terminal of the second rectifier are electrically connected to the first and second memory cells, respectively.

18. The memory structure of claim 15, further comprising:
a first contact rectifier between the first memory cell and the individual contact lines; and
a second contact rectifier between the second memory cell and the individual contact lines.

19. The memory structure of claim 15 wherein at least one of the first and second memory cells includes chalcogenide glass.

20. The memory structure of claim 1 wherein the rectifier device includes two back-to-back P/N junction devices.

21. The memory structure of claim 1 wherein the rectifier device includes two back-to-back N/P junction devices.

22. The memory structure of claim 1 wherein:
the first memory cell includes a first region of chalcogenide glass; and
the second memory cell includes a second region of chalcogenide glass,
wherein the first and second regions of chalcogenide glass are mechanically isolated from one another.

23. The memory structure of claim 6 wherein:
the first contact rectifier comprises a first P/N diode; and
the second contact rectifier comprises a second P/N diode.

24. The memory structure of claim 6 wherein:
the first contact rectifier is buried beneath at least a portion of the first contact line; and
the second contact rectifier is buried beneath at least a portion of the second contact line.

* * * * *

UNITED STATES PATENT AND TRADEMARK OFFICE
CERTIFICATE OF CORRECTION

PATENT NO.         : 8,619,456 B2
APPLICATION NO.    : 12/617501
DATED              : December 31, 2013
INVENTOR(S)        : Jun Liu Page 1 of 1

It is certified that error appears in the above-identified patent and that said Letters Patent is hereby corrected as shown below:

On the Title page, in item (73), in "Assignee", in column 1, line 1, delete "Technology," and insert -- Technology, Inc., --, therefor.

In the Claims:

In column 11, line 32, in Claim 15, after "doping" insert -- region of the two --.

Signed and Sealed this
Fifteenth Day of April, 2014

Michelle K. Lee
*Deputy Director of the United States Patent and Trademark Office*